US011083105B2

(12) United States Patent
Okita et al.

(10) Patent No.: US 11,083,105 B2
(45) Date of Patent: Aug. 3, 2021

(54) HEAT RADIATOR INCLUDING HEAT RADIATING ACCELERATION PARTS WITH CONCAVE AND CONVEX PORTIONS FOR AN AIRCRAFT

(71) Applicants: IHI Corporation, Koto-ku (JP); National University Corporation Tokyo University of Agriculture and Technology, Fuchu (JP)

(72) Inventors: Yoji Okita, Tokyo (JP); Akira Murata, Tokyo (JP)

(73) Assignees: IHI Corporation, Koto-ku (JP); National University Corporation Tokyo University of Agriculture and Technology, Fuchu (JP)

( * ) Notice: Subject to any disclaimer, the term of this patent is extended or adjusted under 35 U.S.C. 154(b) by 0 days.

(21) Appl. No.: 16/378,609

(22) Filed: Apr. 9, 2019

(65) Prior Publication Data

US 2019/0233130 A1    Aug. 1, 2019

Related U.S. Application Data

(63) Continuation of application No. PCT/JP2018/004011, filed on Feb. 6, 2018.

(30) Foreign Application Priority Data

Mar. 7, 2017    (JP) .............................. JP2017-042645

(51) Int. Cl.
*H05K 7/20*    (2006.01)
*B64D 33/10*    (2006.01)
(Continued)

(52) U.S. Cl.
CPC ............... *H05K 7/20* (2013.01); *B64D 33/10* (2013.01); *B64C 25/405* (2013.01);
(Continued)

(58) Field of Classification Search
CPC ...... B64D 13/00; B64D 13/006; B64D 33/10; B64D 47/00; H05K 7/20–2099;
(Continued)

(56) References Cited

U.S. PATENT DOCUMENTS 2,071,744 A * 2/1937 Anathor-Henrikson .....................
B64C 29/0025
244/12.1
2,261,558 A * 11/1941 Orloff ..................... B64C 21/02
244/130
(Continued)

FOREIGN PATENT DOCUMENTS

EP    2 787 173 A1    10/2014
JP    61-181800    8/1986
(Continued)

OTHER PUBLICATIONS

J. F. Fan et al., "Three-Dimensional Numerical Study of Fluid and Heat Transfer Characteristics of Dimpled Fin Surfaces" Numerical Heat Transfer, Part A: Applications, vol. 62, No. 4, XP055746012, Aug. 15, 2012, pp. 271-294 and cover page.

*Primary Examiner* — Richard R. Green
*Assistant Examiner* — Michael A. Fabula
(74) *Attorney, Agent, or Firm* — Oblon, McClelland, Maier & Neustadt, L.L.P.

(57) ABSTRACT

A heat radiator for an aircraft, which cools a heat source installed in the aircraft, includes a heat radiating part in which a contact surface comes into contact with a main flow, the contact surface being formed with a concave portion or a convex portion in which a surface thereof directed upstream in a flow direction of the main flow is curved in a plan view.

4 Claims, 3 Drawing Sheets

(51) Int. Cl.
*B64D 13/00* (2006.01)
*B64C 25/40* (2006.01)
*B64D 47/00* (2006.01)

(52) U.S. Cl.
CPC .......... *B64D 13/006* (2013.01); *B64D 47/00* (2013.01); *B64D 2205/00* (2013.01)

(58) Field of Classification Search
CPC ......... H05K 7/20909–20918; G06F 1/20–206; H01L 23/34–4735; H01L 23/36; H01L 23/367; H01L 23/3672; H01L 23/467; F28F 1/025; F28F 1/06; F28F 1/10; F28F 1/105; F28F 1/12; F28F 1/124; F28F 1/126; F28F 1/42; F28F 3/022; F28F 3/025; F28F 3/044; F28F 3/046; F28F 2215/08; F28F 2215/10
USPC ........................... 165/80.3, 104.33, 179, 182
See application file for complete search history.

(56) References Cited

U.S. PATENT DOCUMENTS

| | | | | |
|---|---|---|---|---|
| 3,151,675 A * | 10/1964 | Lysholm | ............. | F28F 3/04 165/166 |
| 3,262,495 A * | 7/1966 | Baird | ............. | F28F 3/027 165/152 |
| 3,493,040 A * | 2/1970 | Wingate | ............. | C02F 1/08 165/115 |
| 3,578,264 A * | 5/1971 | Kuethe | ............. | B64C 21/10 244/200.1 |
| 3,664,928 A * | 5/1972 | Roberts | ............. | C02F 1/08 202/236 |
| 3,741,285 A * | 6/1973 | Kuethe | ............. | F28F 13/12 165/181 |
| 3,931,854 A * | 1/1976 | Ivakhnenko | ............. | F28D 9/0037 165/166 |
| 4,029,146 A * | 6/1977 | Hart | ............. | F28D 9/0031 165/166 |
| 4,043,388 A * | 8/1977 | Zebuhr | ............. | F28F 17/00 165/166 |
| 4,272,462 A * | 6/1981 | Butt | ............. | F28D 5/02 261/153 |
| 4,420,039 A * | 12/1983 | Dubrovsky | ............. | F28F 13/08 165/152 |
| 4,470,452 A * | 9/1984 | Rhodes | ............. | F28D 1/0391 165/153 |
| 4,535,385 A * | 8/1985 | August | ............. | H01L 23/36 257/E23.101 |
| 4,569,391 A * | 2/1986 | Hulswitt | ............. | F28D 9/0037 165/109.1 |
| 4,687,884 A * | 8/1987 | DeHart | ............. | H01B 5/02 174/128.1 |
| 4,690,211 A * | 9/1987 | Kuwahara | ............. | F28F 1/42 165/177 |
| 5,111,877 A * | 5/1992 | Buchanan | ............. | F28D 1/0341 165/153 |
| 5,171,623 A * | 12/1992 | Yee | ............. | B63B 1/34 114/288 |
| 5,224,538 A * | 7/1993 | Jacoby | ............. | B01D 1/22 165/166 |
| 5,289,997 A * | 3/1994 | Harris | ............. | B62D 35/001 102/501 |
| 5,378,524 A * | 1/1995 | Blood | ............. | F42B 10/22 428/141 |
| 5,628,362 A * | 5/1997 | Rew | ............. | F28F 1/32 165/151 |
| 5,794,684 A * | 8/1998 | Jacoby | ............. | F28F 3/02 165/185 |
| 5,806,584 A * | 9/1998 | Thonon | ............. | F28F 3/046 165/166 |
| 6,006,823 A * | 12/1999 | Kiknadze | ............. | F28F 13/02 165/133 |
| 6,085,830 A * | 7/2000 | Mashiko | ............. | B22D 17/24 165/185 |
| 6,112,806 A * | 9/2000 | Kawaguchi | ............. | C09K 5/08 165/164 |
| 6,840,313 B2 * | 1/2005 | Abiko | ............. | F28F 3/025 165/166 |
| 8,561,451 B2 * | 10/2013 | Opferkuch | ............. | F28F 3/046 72/379.6 |
| 10,118,564 B2 * | 11/2018 | Clark | ............. | B60R 9/05 |
| 2001/0037875 A1 * | 11/2001 | Guerrero | ............. | H01L 23/3672 165/80.3 |
| 2004/0251016 A1 * | 12/2004 | Oh | ............. | F28F 1/32 165/177 |
| 2006/0134379 A1 * | 6/2006 | Pulkka | ............. | B62D 35/00 428/141 |
| 2008/0023180 A1 * | 1/2008 | Bunker | ............. | F28F 13/12 165/109.1 |
| 2008/0043431 A1 * | 2/2008 | Marotta | ............. | H01L 23/467 361/689 |
| 2008/0066888 A1 | 3/2008 | Tong et al. | | |
| 2008/0072425 A1 * | 3/2008 | Whittenberger | ....... | B21D 53/02 29/890.03 |
| 2008/0087409 A1 * | 4/2008 | Nakamura | ............. | F28D 9/0025 165/165 |
| 2009/0180939 A1 * | 7/2009 | Hagen | ............. | F01K 21/047 422/600 |
| 2009/0229801 A1 * | 9/2009 | Stewart | ............. | F28D 1/05366 165/151 |
| 2009/0294596 A1 * | 12/2009 | Sinha | ............. | B61D 17/02 244/200 |
| 2010/0218922 A1 * | 9/2010 | Paulik | ............. | B21D 53/04 165/148 |
| 2011/0056669 A1 | 3/2011 | Pruett et al. | | |
| 2012/0014067 A1 * | 1/2012 | Siracki | ............. | H01L 23/3672 361/709 |
| 2012/0199328 A1 * | 8/2012 | Gong | ............. | F28D 1/0308 165/164 |
| 2013/0319648 A1 * | 12/2013 | Pantow | ............. | F28F 1/128 165/185 |
| 2015/0096728 A1 * | 4/2015 | Agner | ............. | B21D 13/04 165/168 |
| 2015/0198372 A1 * | 7/2015 | Desikan | ............. | H01F 27/105 165/151 |
| 2015/0289413 A1 | 10/2015 | Rush et al. | | |
| 2016/0025423 A1 | 1/2016 | Strange et al. | | |
| 2016/0109188 A1 * | 4/2016 | Juliana | ............. | F28F 1/04 165/181 |
| 2016/0245591 A1 * | 8/2016 | Masgrau | ............. | F28F 3/044 |
| 2016/0290727 A1 * | 10/2016 | Coteus | ............. | F28D 1/0308 |
| 2016/0313071 A1 * | 10/2016 | Andersson | ............. | F28F 3/044 |
| 2016/0348987 A1 * | 12/2016 | Minami | ............. | B23K 1/0012 |
| 2017/0067695 A1 * | 3/2017 | Wei | ............. | F28F 3/042 |
| 2017/0176108 A1 * | 6/2017 | Palanchon | ........ | H01M 10/6567 |
| 2017/0198988 A1 * | 7/2017 | Herring | ............. | F28F 9/0268 |
| 2019/0033011 A1 * | 1/2019 | Zhang | ............. | F28D 9/00 |
| 2019/0204024 A1 * | 7/2019 | Hedberg | ............. | F28D 9/005 |

FOREIGN PATENT DOCUMENTS

| | | |
|---|---|---|
| JP | 64-061999 | 3/1989 |
| JP | 10-030893 | 2/1998 |
| JP | 10-163389 | 6/1998 |
| JP | 2003-110330 | 4/2003 |
| JP | 2012-231017 | 11/2012 |
| JP | 2013-113281 | 6/2013 |
| JP | 2016-025349 | 2/2016 |
| JP | 2016-076684 | 5/2016 |
| WO | WO 03/004868 A2 | 1/2003 |

* cited by examiner

|  |  | CIRCULAR HEAT TRANSFER ACCELERATION PART | HEAT TRANSFER ACCELERATION PART IN THIS EMBODIMENT | OFFSET FIN |
|---|---|---|---|---|
| $Nu/Nu_\infty$ | CONCAVE PORTION | 1.82 | 2.16 | 1.62 |
|  | CONVEX PORTION | 4.48 | 4.77 |  |
|  | AVERAGE | 3.15 | 3.46 |  |
| $Nu/Nu_{\infty,S}$ | CONCAVE PORTION | 1.22 | 1.39 | 1.17 |
|  | CONVEX PORTION | 3.01 | 3.08 |  |
|  | AVERAGE | 2.12 | 2.24 |  |
| $f/f_\infty$ |  | 3.92 | 4.50 | 3.08 |
| $f/f_{\infty,S}$ |  | 4.44 | 5.16 | 3.41 |
| TOTAL HEAT TRANSFER COEFFICIENT $\eta$ |  | 2.12 | 2.24 | 1.17 |

US 11,083,105 B2

HEAT RADIATOR INCLUDING HEAT RADIATING ACCELERATION PARTS WITH CONCAVE AND CONVEX PORTIONS FOR AN AIRCRAFT

CROSS-REFERENCE TO RELATED APPLICATION

This application is a continuation application based on PCT Patent Application No. PCT/JP2018/004011, filed on Feb. 6, 2018, whose priority is claimed on Japanese Patent Application No. 2017-42645, filed on Mar. 7, 2017. The contents of both the PCT application and the Japanese Patent Applications are incorporated herein by reference.

TECHNICAL FIELD

The present disclosure relates to a heat radiator for an aircraft.

BACKGROUND ART

For example, Patent Document 1 discloses a heat sink (a heat radiator) for forced air cooling which has been subjected to heat transfer acceleration part processing. The heat sink disclosed in Patent Document 1 has a plurality of fins arranged at intervals and can release the heat from a heat radiating surface to cooling air by the fins being brought into contact with the cooling air. In each of the fins in the heat sink, a convex portion is formed on a surface thereof and this convex portion accelerates heat transfer to the cooling air. Such a heat sink in Patent Document 1 is used for cooling a heating element such as a power semiconductor element used for driving a railroad vehicle.

CITATION LIST

Patent Document

[Non-Patent Document 1]
  Japanese Unexamined Patent Application, First Publication No. 2012-231017

SUMMARY OF INVENTION

Technical Problem

Incidentally, in recent years, in aircraft, electrification of a drive device for the wheels and the like has advanced, and accordingly it is necessary to install a control unit for controlling the drive device. The control unit has a large number of heat generating parts and generates a large amount of heat. For this reason, in such a control unit, it is necessary to provide a heat radiator. However, the heat sink disclosed in Patent Document 1 does not take into account a pressure loss in a flow path. Therefore, when the pressure loss of the flow path is large, a large-sized compressor is required. In aircraft, since installation space and loading weight are limited, a heat radiator which can cool sufficiently with only a small compressor is necessary.

The present disclosure was made in view of the above-described problems, and an objective of the present disclosure is to improve the cooling performance while minimizing an increase in pressure loss in a heat radiator for an aircraft.

Solution to Problem

The present disclosure adopts the following constitutions as a means for accomplishing the above-described objective.

A first disclosure is a heat radiator for an aircraft which cools a heat source installed in the aircraft including: a heat radiating part in which a contact surface comes into contact with a main flow, the contact surface being formed with a concave portion or a convex portion in which a surface thereof directed upstream in a flow direction of the main flow is curved in a plan view.

According to a second disclosure, in the first disclosure, an outline of the concave portion or the convex portion viewed from a normal direction of the contact surface is symmetrical with respect to a reference axis in the flow direction of the main flow, has a planar shape in which circles having different radii disposed along the reference axis are connected, and is set to have a shape which spreads beyond the center of a small circle of the circles in a direction from the small circle toward a large circle of the circles along the reference axis.

According to a third disclosure, in the second disclosure, the concave portion or the convex portion is formed such that the small circle side thereof is disposed upstream in the flow direction of the main flow.

According to a fourth disclosure, in any one of the first to third disclosures, the concave portion is formed on a first surface of the heat radiating part and the convex portion is formed on a second surface of the heat radiating part opposite to the first surface.

According to a fifth disclosure, in the fourth disclosure, the concave portion formed on the first surface and the convex portion formed on the second surface are disposed to overlap when viewed from a normal direction of the contact surface.

Effects of Invention

According to the present disclosure, a concave portion or a convex portion is formed in a heat radiating part of a heat radiator for an aircraft. Thus, when a fluid passes through the inside of the heat radiator for an aircraft, the fluid comes into contact with the concave portion or the convex portion. Thus, it is possible to accelerate heat radiation. Furthermore, when a surface directed upstream in a flow direction of a main flow has a curved surface shape, a flow direction of a fluid gradually changes along the surface. Thus, in the concave portion or the convex portion of the heat radiator according to the present disclosure, a pressure loss hardly increases. Therefore, it is possible to improve the cooling performance while minimizing an increase in pressure loss.

DESCRIPTION OF EMBODIMENTS

Figure 1:
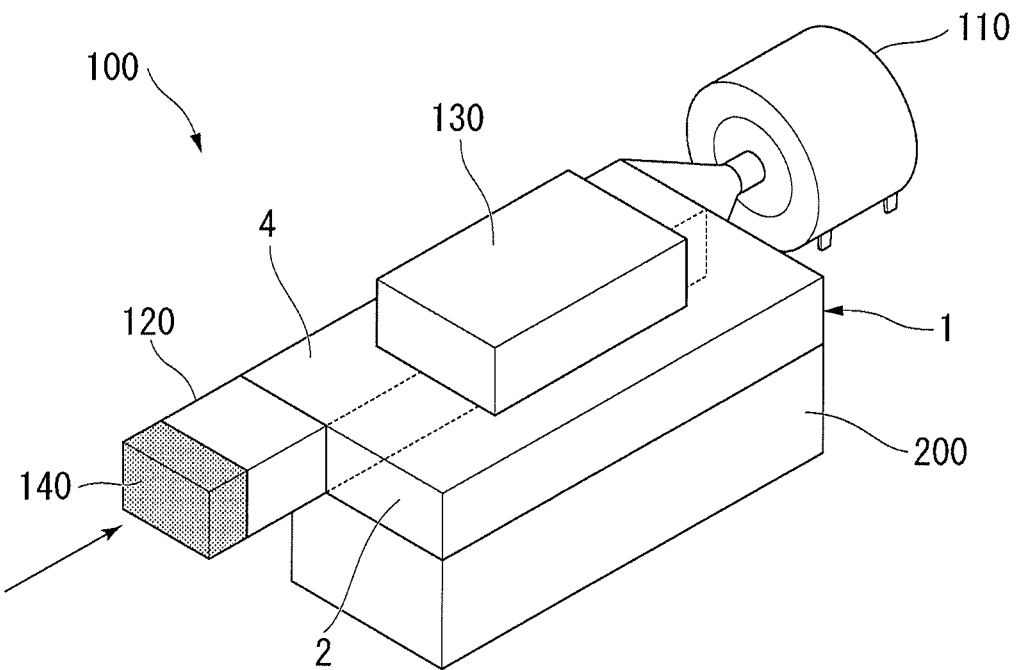
FIG. 1 is a schematic diagram of a cooling system including a heat radiator according to an embodiment of the present disclosure.

An embodiment of a heat radiator associated with the present disclosure will be described below with reference to the drawings. Note that, in the following drawings, in order to make members have recognizable sizes, the scale of the members may be appropriately varied. FIG. 1 is a schematic diagram of a cooling system 100 including a heat radiator 1 according to this embodiment.

For example, the cooling system 100 according to this embodiment is used for cooling a taxiing motor controller 200 (a heat source) which controls driving of wheels of an aircraft. In addition, as shown in FIG. 1, the cooling system 100 includes a compressor 110, a compressor motor controller 120, an external connection duct 130, a filter 140, and the heat radiator 1. The taxiing motor controller 200 includes a drive circuit and the like and has a high temperature when the aircraft is moved. The compressor 110 is connected to an exhaust side of the heat radiator 1 and discharges cooling air having passed through the heat radiator 1 outside. The compressor motor controller 120 is a device for controlling driving of the compressor 110 and is disposed above the heat radiator 1 for removing heat.

The external connection duct 130 is attached to an air intake side of the heat radiator 1 and is connected to an intake port (not shown) through which air in the aircraft is introduced as cooling air. Furthermore, in the external connection duct 130, the filter 140 is provided in a connection portion between the external connection duct 130 and the intake port. The filter 140 prevents particles such as dust contained in air in the aircraft from flowing into the heat radiator 1.

Figure 2:
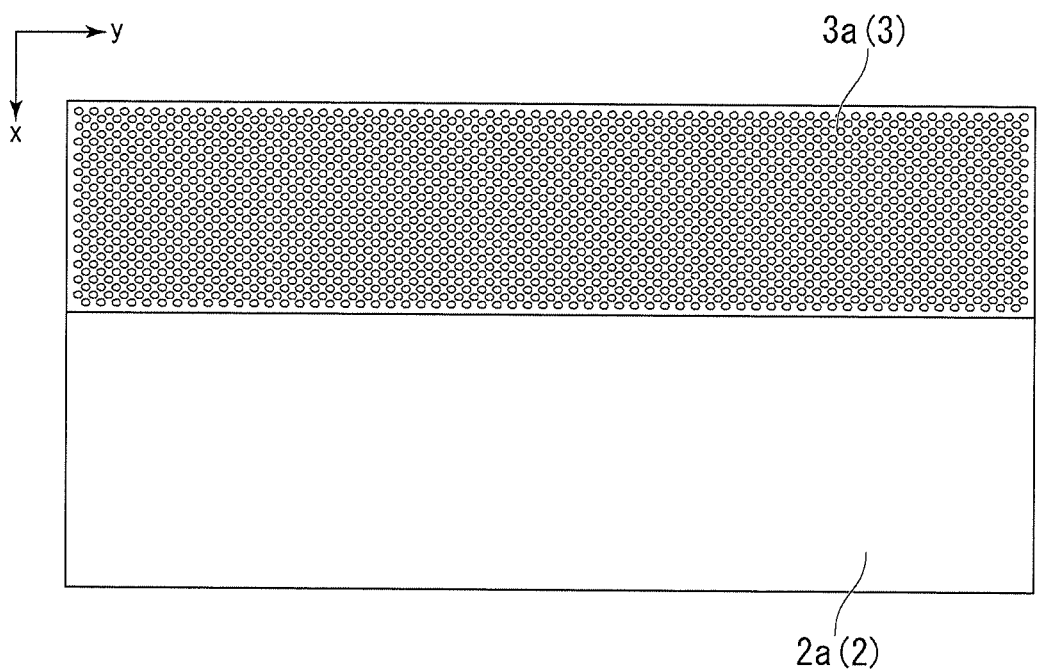
FIG. 2 is a plan view showing a heat transfer part and a heat radiating part of the heat radiator according to the embodiment of the present disclosure.
Figure 3:
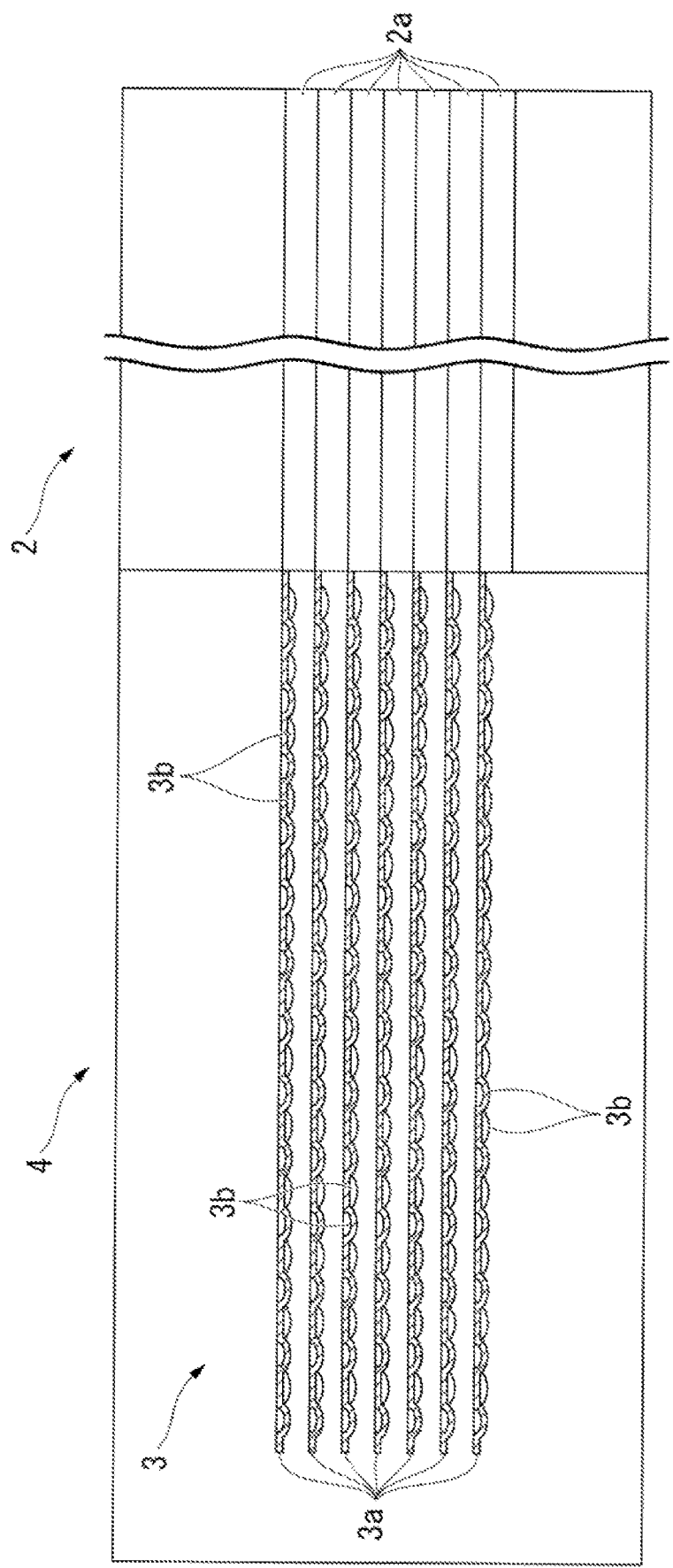
FIG. 3 is a cross-sectional view of the heat transfer part and the heat radiating part of the heat radiator according to the embodiment of the present disclosure.

FIG. 2 is a plan view showing a heat transfer part 2 and a heat radiating part 3 of the heat radiator 1 according to this embodiment. FIG. 3 is a cross-sectional view of the heat transfer part 2 and the heat radiating part 3 of the heat radiator 1 according to this embodiment.

The heat radiator 1 is a heat radiator for an aircraft and includes the heat transfer part 2, the heat radiating part 3 (refer to FIG. 2), and a heat radiating duct 4. The heat transfer part 2 is a substantially rectangular parallelepiped member constituted by laminating and bonding together a plurality of metallic Plate members 2a having a high heat conductivity. The heat transfer part 2 is in contact with the taxiing motor controller 200 and the compressor motor controller 120 and transfers the heat of the taxiing motor controller 200 and the compressor motor controller 120 to the heat radiating part 3.

The heat radiating part 3 is provided in the heat radiating duct 4 and includes a plurality of elongated heat radiating plates 3a, and the plurality of heat radiating plates 3a are laminated while leaving gaps between. The heat radiating plates 3a are elongated thin plates fixed to the heat transfer part 2 in which a portion of the heat radiating plates 3a in a longitudinal direction is in contact with portions of the laminated Plate members 2a of the heat transfer part 2 in the longitudinal direction. On each of the heat radiating plates 3a, a plurality of heat radiating acceleration parts 3b are formed at equal intervals on the contact surface in contact with the cooling air.

Figures 4, 5:
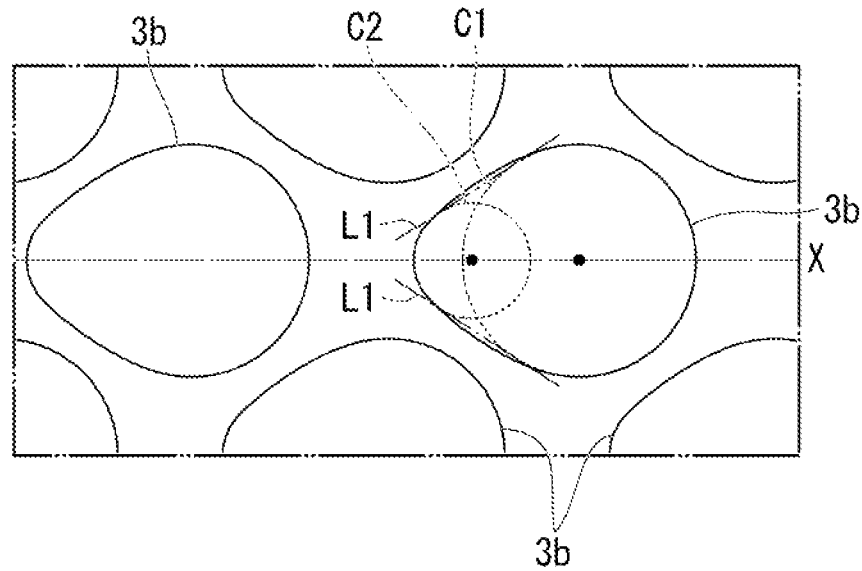
FIG. 4 is an enlarged view of a heat radiating plate of the heat radiator according to the embodiment of the present disclosure.
FIG. 5 is a table showing the results of performance evaluation concerning the heat radiating plate in this embodiment of the present disclosure, a heat radiating plate having a heat transfer accelerating part with a circular planar shape provided therein, and a conventional offset fin.

FIG. 4 is an enlarged view of the heat radiating plate 3a of the heat radiator 1 according to this embodiment.

The plurality of heat radiating acceleration parts 3b are provided on the heat radiating plate 3a to improve a coefficient of heat transfer with respect to between the heat radiating plate 3a and the cooling air. Each of the heat radiating acceleration parts 3b is formed, for example, by performing press working on the heat radiating plate 3a, and as shown in FIG. 3, has a concave portion in a first surface which is a contact surface with respect to the heat radiating plate 3a and a convex portion at the same position on a second surface opposite to the contact surface. As shown in FIG. 4, the outline of the heat radiating acceleration part 3b viewed in a normal direction of the first surface and the second surface is symmetrical with respect to a reference axis X in the longitudinal direction. Furthermore, the outline of the heat radiating acceleration part 3b is formed by disposing a large circle C1 (a large circle) and a small circle C2 (a small circle) having a smaller diameter than the large circle C1 such that they have centers on a reference axis X and connecting the large circle C1 to the small circle C2 with curved lines obtained by slightly widening common tangent lines L1 of the large circle C1 and the small circle C2 outward. The outline of the heat radiating acceleration part 3b is formed as an outline of a figure obtained from the large circle C1, the small circle C2, and the curved lines obtained by slightly swelling the common tangent lines L1 outward. That is to say, the outline of the heat radiating acceleration part 3b is set to have a shape in which the small circle C2 spreads to the large circle C1 beyond the center of the small circle C2 in a direction from the small circle C2 toward the large circle C1 along the reference axis X. Furthermore, when the reference axis X of the heat radiating acceleration part 3b is disposed in a flow direction of the main flow of the cooling air, the large circle C1 is downstream in the flow direction of the cooling air along the reference axis X and the small circle C2 is upstream in the flow direction of the cooling air. The outline of the heat radiating acceleration part 3b has a shape in which a surface of the heat radiating acceleration part 3b directed upstream in the flow direction of the main flow of the cooling air is curved.

Also, a cross-sectional shape of the concave portion in the heat radiating acceleration part 3b is set such that a portion of the concave portion at a position in which the concave portion and a center of the large circle C1 overlap is the deepest in the normal direction of the first surface and becomes shallower toward an outer edge of the small circle C2. Thus, the cross-sectional shape of the concave portion in the heat radiating acceleration part 3b has a shape in which the concave portion gently slopes from an edge portion thereof upstream in the flow direction of the main flow and sharply rises from the portion of the concave portion at a position at which the concave portion and a center of the large circle C1 overlap to an edge portion thereof downstream in the flow direction of the main flow. Furthermore, the cross-sectional shape of the concave portion in the heat radiating acceleration part 3b is symmetrical with respect to the reference axis X.

As shown in FIG. 2, the plurality of heat radiating acceleration parts 3b are arranged in a direction along the flow direction of the cooling air and are arranged in a direction intersecting the flow direction of the cooling air.

The heat radiating duct 4 is a tubular member which has one end connected to the external connection duct 130 and the other end connected to the compressor 110. This heat radiating duct 4 has the heat radiating part 3 accommodated therein and forms a flow path through which the heat radiating part 3 is passed.

An operation of the cooling system 100 according to this embodiment will be described.

The taxiing motor controller 200 generates heat due to a load applied to a circuit when the aircraft navigates and thus a surface temperature rises. The heat transfer part 2 in contact with the taxiing motor controller 200 transmits the heat of the taxiing motor controller 200 to the heat radiating plates 3a in the heat radiating part 3.

When the compressor 110 is driven, air flows from the inside of the aircraft into the heat radiating duct 4 via the external connection duct 130 as a cooling air. The heat radiating part 3 is accommodated in the heat radiating duct 4 and protrudes into the flow path for the cooling air. In addition, when the cooling air is brought into contact with the heat radiating part 3, the heat of the heat radiating part 3 is transmitted to the cooling air. At that time, on the first surface of the heat radiating plate 3a, the cooling air flows into a region on the small circle C2 side of the concave portion, flows into the concave portion along a curved surface on the small circle C2 side in the flow direction of the main flow, and flows outside of the concave portion.

Also, on the second surface of the heat radiating plate 3a, the cooling air flows along an outer circumference of the convex portion along a surface on the large circle C1 side of the convex portion in the flow direction of the main flow. Thus, when the cooling air flows along the heat radiating acceleration parts 3b, heat is transmitted to the cooling air. Since such a plurality of heat radiating acceleration parts 3b are arranged in the flow direction of the cooling air, the heat radiating plate 3a can transmit a lot of heat to the cooling air.

In addition, the cooling air having heat transmitted thereto is suctioned up by the compressor 110 and then discharged outside of the cooling system 100.

The results of evaluating the performance of the heat radiating plate 3a in this embodiment will be described with reference to FIG. 5. FIG. 5 is a table showing the results of performance evaluation concerning the heat radiating plate 3a in this embodiment, the heat radiating plate 3a having the heat transfer accelerating parts 3b with a circular planar shape provided therein, and a conventional offset fin. In this performance evaluation, the offset fin to be compared has a constitution in which concaves and convexes are formed by processing a Plate member into a wave shape and a surface having such concaves and convexes facing the cooling air is planar.

In the table of FIG. 5, as a numerical value indicating a coefficient of heat transfer, a value obtained by normalizing a Nusselt number Nu in each heat radiator with a Nusselt number $Nu_\infty$ on a smooth surface and a value obtained by normalizing the Nusselt number Nu in each heat radiator with the Nusselt number $Nu_{\infty,S}$ under the same blowing power conditions on a smooth surface are used. The same blowing power condition mentioned herein refers to a condition in which the power of blowing air, that is, differential pressures are the same. In other words, it can be said that pressure losses are the same. Furthermore, in the table in FIG. 5, as a numerical value indicating frictional resistance, a value obtained by normalizing a coefficient of friction f in each heat radiator with a coefficient of friction f on a smooth surface and a value obtained by normalizing the coefficient of friction $f_\infty$ in each heat radiator with a coefficient of friction $f_{\infty,S}$ under the same blowing power condition on a smooth surface are used. In addition, a total heat transfer coefficient η shown in the table in FIG. 5 is a dimensionless number used for evaluating a total frictional force (a pressure loss) and a coefficient of heat transfer. The total heat transfer coefficient η is provided by the following expression 1 using a Stanton number St and the coefficient of friction f. It should be noted that the Stanton number St is a dimensionless number representing heat transfer from an object. Furthermore, $St_{\infty,S}$ indicates a Stanton number on a smooth surface under the same blowing power condition. It should be noted that the larger the value of the total heat transfer coefficient η is, the higher the coefficient of heat transfer is with respect to the magnitude of the coefficient of friction.

[Math. 1]

$$\eta = \frac{\frac{St}{St_{\infty,S}}}{\left(\frac{f}{f_{\infty,S}}\right)^{\frac{1}{3}}} \quad (1)$$

Comparing the heat radiating plate 3a in this embodiment with a value obtained by normalizing a Nusselt number Nu in each heat radiating plate with a conventional offset fin with the Nusselt number $Nu_\infty$ on a smooth surface, average values of the concave portion side and the convex portion side of the heat radiating acceleration part 3b in the heat radiating plate 3a are at least twice the coefficient of heat transfer of the conventional offset fin and the coefficient of heat transfer has been greatly improved. In addition, comparing the values obtained by normalizing the Nusselt number Nu in the heat radiating plates with the Nusselt number $Nu_{\infty,S}$ under the same blowing power condition, it can be seen that average values of the concave portion side and the convex portion side of the heat radiating acceleration part 3b in the heat radiating plate 3a are further larger than that of the conventional offset fin. That is to say, it can be seen that the heat radiating plate 3a of this embodiment has a significantly improved heat transfer efficiency as compared to the conventional offset fin.

Also, comparing the coefficients of friction of the heat radiating plate 3a in this embodiment with the conventional offset fin, in any of the air blowing conditions, the coefficient of friction of the heat radiating plate 3a in this embodiment increases. Moreover, the total heat transfer coefficient η of the heat radiating plate 3a in this embodiment is approximately twice as large as that of the conventional offset fin. That is to say, the heat radiator 1 has a coefficient of heat transfer for having a much higher heat transfer rate than a rate of an increase in friction as compared to the conventional offset fin. That is to say, the heat radiating plate 3a can minimize the pressure loss due to friction and improve the efficiency of heat transfer as compared to the conventional offset fin. Thus, even when an area required for securing an amount of heat radiation is small, a sufficient effect can be exerted.

Also, in the heat radiating plate 3a in this embodiment, comparing the concave portion with the convex portion in the heat radiating acceleration part 3b, it can be shown that the coefficient of heat transfer of the convex portion is high in any of air blowing conditions. In such a heat radiating plate 3a in this embodiment, the coefficient of heat transfer is improved using the convex portion of the heat radiating acceleration part 3b and an increase in friction is minimized using the concave portion thereof.

Furthermore, also when comparing the heat radiating plate having the circular heat radiating acceleration part 3b with the conventional offset fin, the heat radiating plate having the circular heat radiating acceleration part 3b has a coefficient of heat transfer which is twice that of the conventional offset fin. In addition, the heat radiating plate having the circular heat radiating acceleration part 3b has a coefficient of friction lower than that of the heat radiating plate 3a in this embodiment. Therefore, the heat radiating plate having the circular heat radiating acceleration part 3b has a total heat transfer coefficient lower than that of the heat radiating plate 3a in this embodiment, but twice that of the conventional offset fin and has a total heat transfer coefficient n greatly improved as compared to the conventional offset fin.

According to the heat radiator 1 associated with this embodiment, the heat radiating acceleration part 3b is formed on the heat radiating part 3. Thus, when cooling air passes through the heat radiating duct 4, the cooling air comes into contact with the heat radiating acceleration part 3b. Since a fluid flows along a surface of the heat radiating acceleration part 3b when a surface directed in the flow direction of the main flow of the cooling air has a curved surface shape, it is difficult for a pressure loss to increase. Furthermore, as shown in FIG. 5, the heat radiating acceleration part 3b has a coefficient of heat transfer significantly improved as compared to that of the conventional offset fin. Therefore, the cooling performance can be improved in the heat radiator 1 according to this embodiment while minimizing an increase in pressure loss. Moreover, since an increase in pressure loss in the heat radiator 1 is minimized, it is possible to apply a compact compressor 110.

The heat radiator 1 according to this embodiment has an outer shape which is a figure obtained by connecting the large circle C1 and the small circle C2 using the common tangent lines L1. Thus, it is possible to improve the coefficient of heat transfer of the heat radiator 1 as compared with that of the heat radiating plate having the circular heat radiating acceleration part 3b. Therefore, the cooling performance can be further improved in the heat radiator 1.

In the heat radiator 1 according to this embodiment, the heat radiating acceleration part 3b is formed such that the large circle C1 is disposed upstream in the flow direction of the cooling air and the small circle C2 is disposed downstream in the flow direction of the cooling air. Thus, a surface directed in the flow direction of the cooling air at the convex portion of the heat radiating acceleration part 3b has a curved surface shape with a large radius of curvature and it is possible to minimize the resistance to the cooling air.

In the heat radiator 1 according to this embodiment, in the heat radiating plate 3a, the concave portion is formed in the first surface and the convex portion is formed on the second surface. The heat radiator 1 improves the coefficient of heat transfer using the convex portion and minimizes an increase in pressure loss using the concave portion. Therefore, the cooling performance can be improved in the heat radiator 1 according to this embodiment while minimizing an increase in pressure loss.

Although the preferred embodiment of the present disclosure has been described with reference to the drawings, the present disclosure is not limited to the above-described embodiment. Various shapes, combination, and the like of the constituent elements shown in the above-described embodiment are mere examples and various modifications can be provided on the basis of design requirements and the like without departing from the gist of the present disclosure.

For example, in the above-described embodiment, the heat radiating acceleration part 3b has an outer shape which is figure obtained by connecting the large circle C1 and the small circle C2 using the common tangent lines L1. However, the present disclosure is not limited thereof and the concave portion and the convex portion of the heat radiating acceleration part 3b may have a circular outer shape. As shown in FIG. 5, the heat radiating plate having the circular heat radiating acceleration part 3b has an improved total heat transfer coefficient η as compared to that of the conventional offset fin. Therefore, even when the outer shape corresponds to the circular heat radiating acceleration part 3b, it is possible to ensure sufficient cooling performance. In addition, compared to the heat radiator 1 according to the embodiment, the heat radiating plate having the circular heat radiating acceleration part 3b has a small coefficient of friction and it is possible to minimize a pressure loss to a low level.

Also, in the heat radiating plate 3a, it is also possible to adopt a constitution in which concave portions and convex portions are formed to be mixed on both surfaces of the first surface and the second surface, that is, a constitution in which both a concave portion and a convex portion are formed on one surface. In this case, it is possible to reduce a difference between the coefficient of friction and the coefficient of heat transfer of the first surface and the second surface in the heat radiating plate 3a and to reduce a difference between the total heat transfer coefficients of the first surface and the second surface.

Also, an object to be cooled by the heat radiator 1 is not limited to the taxiing motor controller 200 and may be any heat generating part. In addition, it is also possible to change a shape of a heat transfer surface of the heat transfer part 2 in accordance with a shape of a part to be cooled.

Furthermore, in the heat radiating plate 3a, it is also possible to adopt a constitution in which only a concave portion or only a convex portion is provided as the heat radiating acceleration part 3b formed on the first surface and the second surface. When only a concave portion is provided as the heat radiating acceleration part 3b, it is possible to further reduce a pressure loss of the cooling air. In addition, when only a convex portion is provided as the heat radiating acceleration part 3b, it is possible to improve the coefficient of heat transfer with respect to the cooling air.

INDUSTRIAL APPLICABILITY

According to the present disclosure, in a heat radiator for an aircraft, it is possible to improve the cooling performance while minimizing an increase in pressure loss.

What is claimed is:

1. A heat radiator for an aircraft which cools a heat source, comprising:
 a plurality of heat radiating plates including a first heat radiating plate and a second heat radiating plate being parallel to each other; and
 a heat radiating duct in which the plurality of heat radiating plates are provided,
 wherein the first heat radiating plate includes a first surface facing the second heat radiating plate, and the second heat radiating plate includes a second surface facing the first surface, the first surface and the second surface being along a main flow and coming into contact with the main flow,
 wherein a concave portion is formed on the first surface, and a convex portion is formed on the second surface,
 wherein an outline of at least one of the concave portion or the convex portion viewed in a normal direction of the first surface or the second surface is symmetrical with respect to a reference axis in a flow direction of the main flow and has an outline of a figure formed by disposing a large circle and a small circle having a diameter less than that of the large circle such that the large and small circles have centers on the reference axis and connecting the large circle to the small circle with curved lines obtained by slightly widening two common tangent lines of the large circle and the small circle outward, wherein when viewed in the normal direction, part of an outer edge of the small circle corresponds to an upstream end in the flow direction of the concave portion or the convex portion, and part of an outer edge of the large circle corresponds to a downstream end in the flow direction of the concave portion or the convex portion, and wherein when viewed in the normal direction, the center of the small circle is positioned inside the outer edge of the large circle.

2. The heat radiator for an aircraft according to claim 1, wherein an outline of the other of the at least one of the concave portion or the convex portion viewed in a normal direction of the first surface is symmetrical with respect to the reference axis and has an outline of a figure formed by disposing a large circle and a small circle having a diameter less than that of the large circle such that the large and small circles have centers on the reference axis and connecting the large circle to the small circle with curved lines obtained by slightly widening two common tangent lines of the large circle and the small circle outward, wherein when viewed in the normal direction of the first surface, part of an outer edge of the small circle corresponds to an upstream end in the flow direction of the concave portion, and part of an outer edge of the large circle corresponds to a downstream end in the flow direction the other of the concave portion or convex portion, and wherein a portion of the concave portion at a position in which the concave portion and the center of the large circle overlap is deepest in the normal direction of the first surface, and the concave portion becomes shallower toward the part of the outer edge of the small circle from the position.

3. The heat radiator for an aircraft according to claim 1, wherein the concave portion and the convex portion have perimeters of the respective first and second surfaces which overlap in the normal direction.

4. A cooling system comprising:
a heat radiator for an aircraft according to claim 1;
a compressor that is connected to a downstream end in the flow direction of the heat radiating duct and that discharges cooling air having passed through the heat radiating duct; and
a heat transfer part configured of a plurality of metallic plate members contacting the plurality of heat radiating plates, the heat transfer part contacting the heat source.

* * * * *